United States Patent
Hsu et al.

(10) Patent No.: US 10,985,770 B2
(45) Date of Patent: Apr. 20, 2021

(54) OPERATION METHOD WITH REDUCING QUANTIZATION ERROR AND CIRCUIT THEREOF

(71) Applicant: SENSORTEK TECHNOLOGY CORP., Zhubei (TW)

(72) Inventors: Jer-Hau Hsu, Zhubei (TW); Tsung-Han Wu, Zhubei (TW); Kian-Fu Wong, Zhubei (TW); Meng-Yong Lin, Zhubei (TW)

(73) Assignee: Sensortek Technology Corp., Zhubei (TW)

(*) Notice: Subject to any disclaimer, the term of this patent is extended or adjusted under 35 U.S.C. 154(b) by 0 days.

(21) Appl. No.: 16/819,583

(22) Filed: Mar. 16, 2020

(65) Prior Publication Data

US 2020/0389177 A1 Dec. 10, 2020

Related U.S. Application Data

(60) Provisional application No. 62/818,819, filed on Mar. 15, 2019.

(51) Int. Cl.
*H03M 1/08* (2006.01)

(52) U.S. Cl.
CPC ............... *H03M 1/0854* (2013.01)

(58) Field of Classification Search
CPC ................................ H03M 1/0854
See application file for complete search history.

(56) References Cited

U.S. PATENT DOCUMENTS

| 7,907,061 B2* | 3/2011 | Lin ............ G06F 1/3203 340/686.6 |
| 9,146,304 B2* | 9/2015 | Land ............ G01S 17/04 |

* cited by examiner

*Primary Examiner* — Khai M Nguyen
(74) *Attorney, Agent, or Firm* — Rosenberg, Klein & Lee

(57) ABSTRACT

The present application relates to a method for operating sensing signals and the circuit thereof. An analog-to-digital converter first processes the input signal having the most significant bit (MSB DATA) data at least once. Afterwards, the analog-to-digital converter processes the input signal having the least significant bit (LSB) data and the MSB data and sums all the input signals. Thereby, the process steps of the analog-to-digital converter can be simplified and the processing time can be shortened.

5 Claims, 12 Drawing Sheets

OPERATION METHOD WITH REDUCING QUANTIZATION ERROR AND CIRCUIT THEREOF

FIELD OF THE INVENTION

The present application relates generally to an operational method, and particularly to a method for operating sensing analog signals.

BACKGROUND OF THE INVENTION

Proximity sensors (PS) and ambient light sensors (ALS) have been widely applied to electronic devices such as smartphones, tablets, or portable mobile devices everyone owns. The typical application is when a user is making a call using a smartphone, a proximity sensor will be used to detect the distance between the user and the panel of the smartphone so that the control unit therein can judge whether to shut down the touch or display functions on the panel according to the sensing result of the proximity sensor.

As shown in FIG. 1A and FIG. 1B, according to the prior art, the proximity sensor 1' uses a light source 2' to generate a light beam L1 (for example, the infrared generated by a light-emitting diode), which is reflected by a reflective object O (for example, a human body or another object capable of reflecting light) and generating a reflective light beam L2. The reflective light beam L2 is received by a photosensor 3' and hence providing the result of distance sensing. The sensing result of the photosensor 3' includes the component of ambient light A. To avoid the influence by the ambient light A, the photosensor 3' can sense when the light source 2' is on and off, respectively. Then the component of the ambient light A can be subtracted for eliminating the influence form the ambient light. Nonetheless, as shown in FIG. 2A and FIG. 2B, once the ambient light A comes from a fluorescent lamp powered by an AC power source, the luminance of the ambient light A is undulated. If the sensing duration between an ON state and an OFF state of the light source 2' is too long, the luminance sensed by the photosensor 3' will differ significantly, as the first sensing duration gap1 shown in FIG. 2A. The significant difference will result in larger sensing error because the proximity sensor 1' cannot eliminate the component of the ambient light A effectively. To prevent excessive error caused by the ambient light, the sensing duration between an ON state and an OFF state of the light source 2' will generally be shortened for reducing the difference in luminance between two measurements for the ambient light A, as the second sensing duration gap2 shown in FIG. 2B. In addition, multiple measurements will be performed for calibrating the sensing results.

Unfortunately, when the photosensor 3' uses an analog-to-digital converter (ADC) to convert each sensing result to digital values, most-significant-bit (MSB) operations and least-significant-bit (LSB) operations, will be involved. Due to the resolution limitation of the analog-to-digital converter on the LSB operations, quantization errors will occur. In other words, each sensing result includes quantization errors. Consequently, when the proximity sensor 1' acquires the final sensing result after calibration using multiple sensing results of the ON and OFF states of the light source 2', the final sensing result will include the sum of multiple quantization errors, which will deteriorate the accuracy of the proximity sensor 1'.

Accordingly, the present application provides a method for operating sensing signals for reducing quantization errors. Furthermore, by reducing merge operations for LSB, the operating time of the analog-to-digital converter will be shortened.

SUMMARY

An objective of the present application is to provide a method for operating sensing signals. By reducing LSB operations, adopting accumulation operations for MSB, and performing accumulation operations along with merge operations for LSB in the final stage, the operation process of an analog-to-digital converter can be simplified. Thereby, the quantization error in the output of the analog-to-digital converter will be reduced.

The present application discloses a method for operating sensing signals. First, operate an input signal to generate the corresponding output result and extract a corresponding MSB data. Then the residue is merged to the next input signal. The operation is repeated until the final operation, in which the corresponding MSB data and LSB data of the last input signal are merged. By performing merge operation on the MSB data and LSB data, an output signal will be generated. Accordingly, by reducing operations on the LSB data, the time for the overall summation operations can be shortened and the quantization error can be reduced.

DETAILED DESCRIPTION

In order to make the structure and characteristics as well as the effectiveness of the present application to be further understood and recognized, the detailed description of the present application is provided as follows along with embodiments and accompanying figures.

In the process of analog-to-digital conversion according to the prior art, the MSB data and LSB consume a large proportion of operating time. Besides, each conversion operation induces a plurality of quantization errors. If the quantization errors and the conversion time can be both reduced, effective analog-to-digital conversion with low-error can be achieved. Accordingly, the present application provides an operation method for sensing signals and the circuit thereof for solving the problems of longer operating time and larger quantization errors that occurred in the prior art.

In the following, the properties and the accompanying structure of the method for operating sensing signals and the circuit thereof according to the present application will be further described.

Figure 1A:
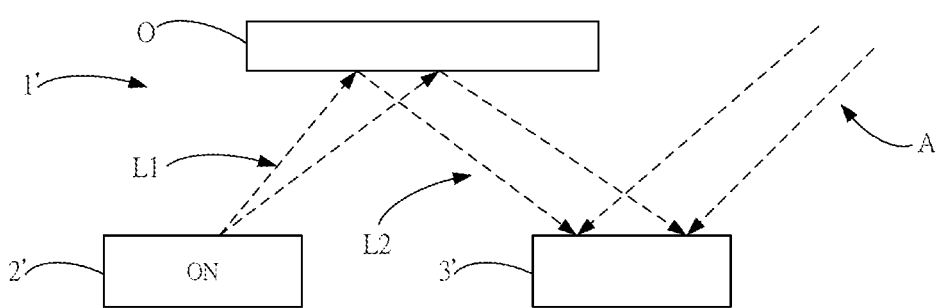
FIG. 1A shows a schematic diagram of proximity sensing when the light source is ON according to the prior art.
Figure 1B:
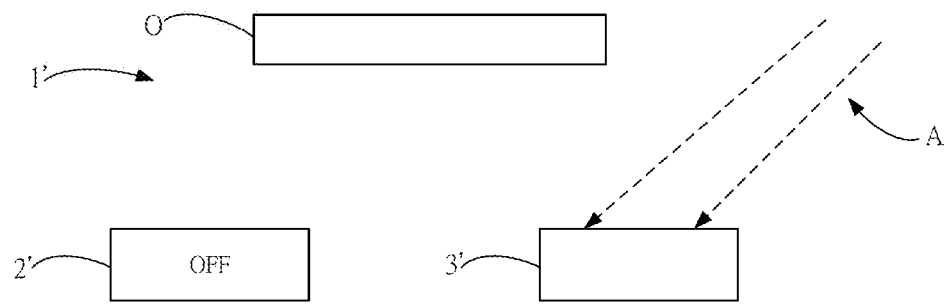
FIG. 1B shows a schematic diagram of proximity sensing when the light source is OFF according to the prior art.
Figure 2A:
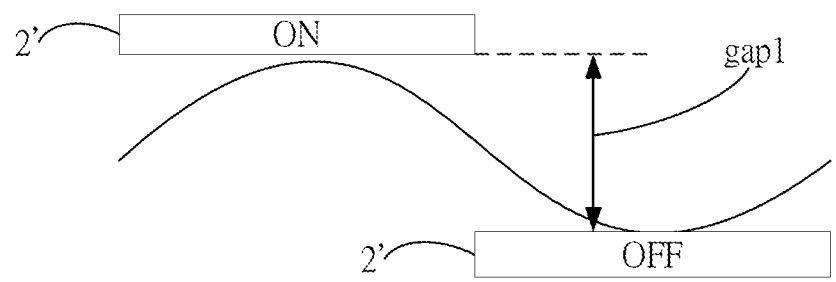
FIG. 2A shows a schematic diagram of distance sensing for AC signal according to the prior art.
Figure 2B:
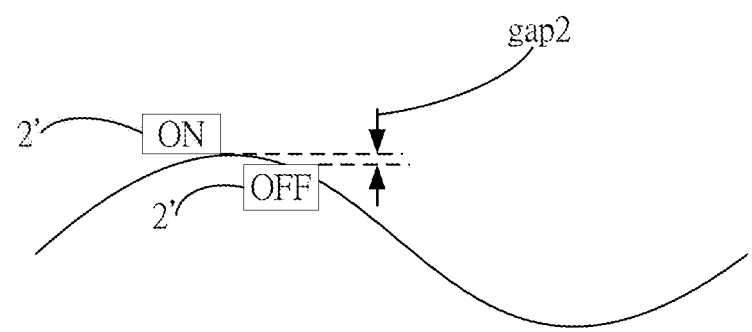
FIG. 2B shows a schematic diagram of distance sensing for AC signal according to the prior art.
Figure 3:
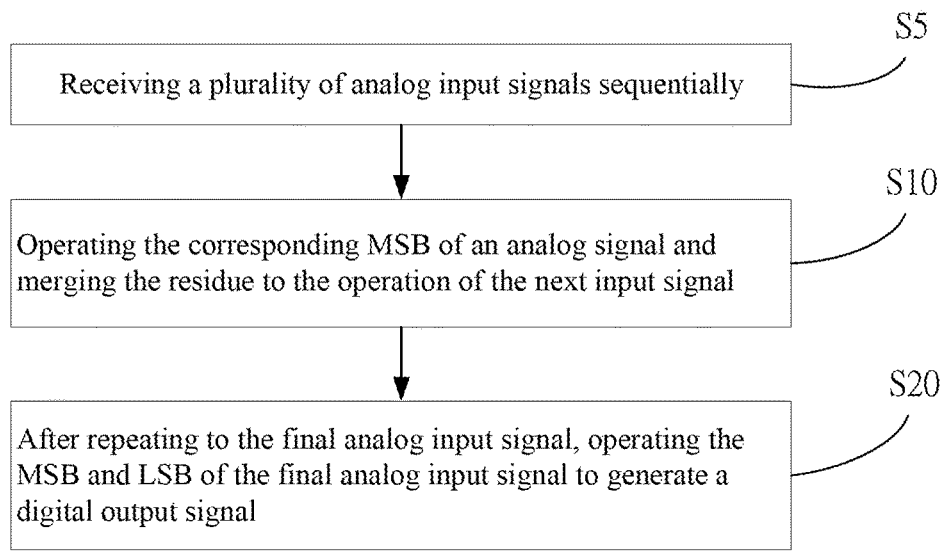
FIG. 3 shows a flowchart according to an embodiment of the present application.

First, please refer to FIG. 3, which shows a flowchart according to an embodiment of the present application. As shown in the figure, the method for operating sensing signals according to the present application is applied to the input and output of an analog-to-digital converter, and comprises steps of:

Step S5: Receiving a plurality of analog input signals sequentially;

Step S10: Operating the corresponding MSB data of an analog signal and merging the residue to the operation of the next input signal; and Step S20: After repeating to the final analog input signal, operating the MSB data and LSB of the final analog input signal to generate a digital output signal.

In the step S5, receive a plurality of analog input signals sequentially. Next, in the step S10, perform accumulation operations on a plurality of MSB data of the plurality of analog input signals and merge the residue of each MSB data operation to the next analog input signal. In the step S20, when the operations are performed to the final one of the plurality of analog input signals, the final MSB data and LSB data are operated together. Thereby, only one LSB operation is performed for generating each output signal. In respect of the number of quantization errors, each digital output signal includes only one quantization error, and hence minimizing the influence of quantization errors of LSB operations on the accuracy of the sensing result significantly.

Figure 4:
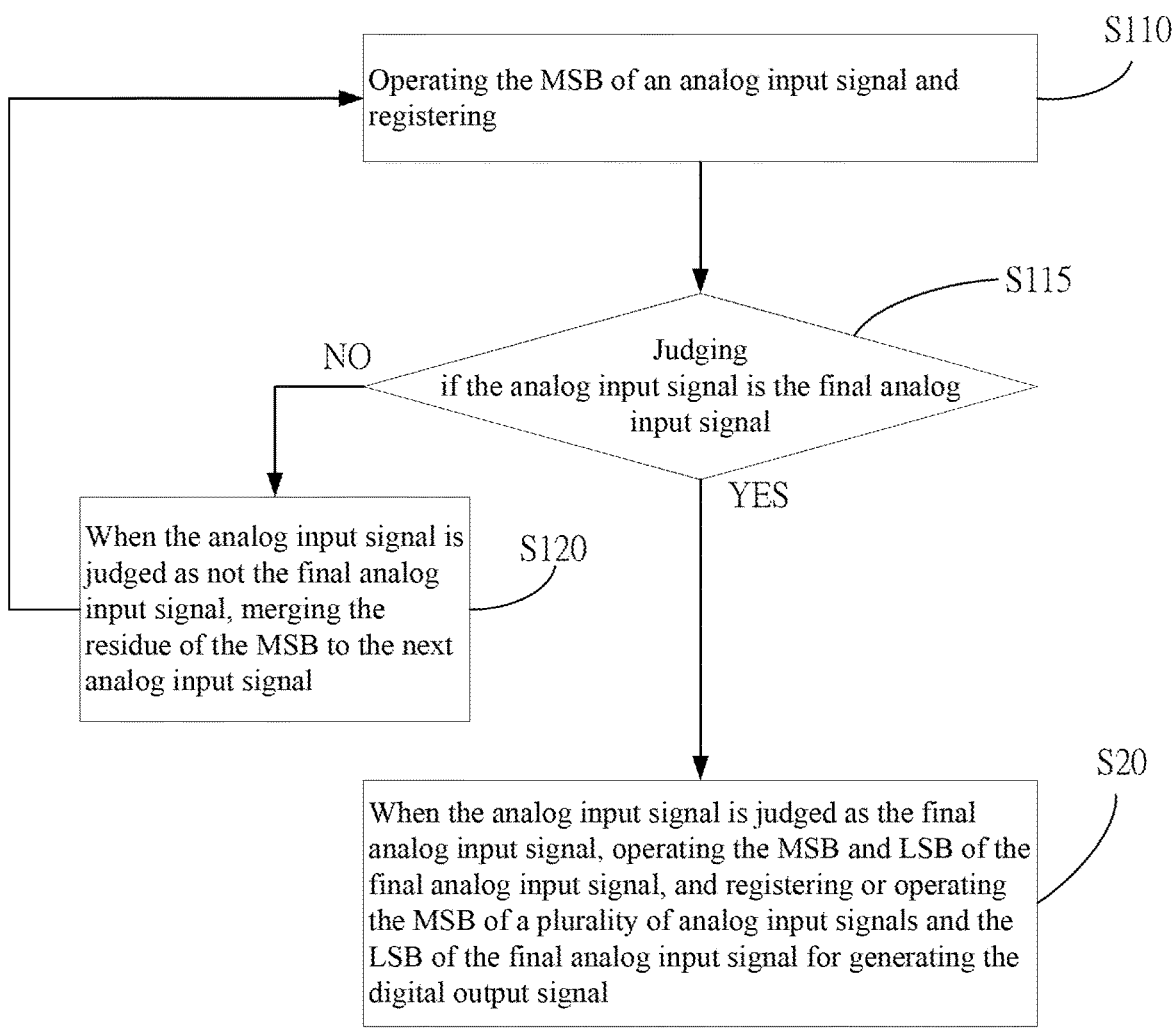
FIG. 4 shows a flowchart for describing the details of FIG. 3.

Furthermore, as shown in FIG. 4, the step S10 includes:

Step S110: Operating the MSB data of an analog input signal and registering;

Step S115: Judging if the analog input signal is the final analog input signal; and Step S120: When the analog input signal is judged as not the final analog input signal, merging the residue of the MSB data to the next analog input signal;

Step S20: When the analog input signal is judged as the final analog input signal, operating the MSB data and LSB data of the final analog input signal, and registering or operating the MSB data of a plurality of analog input signals and the LSB data of the final analog input signal for generating the digital output signal.

Figure 5A:
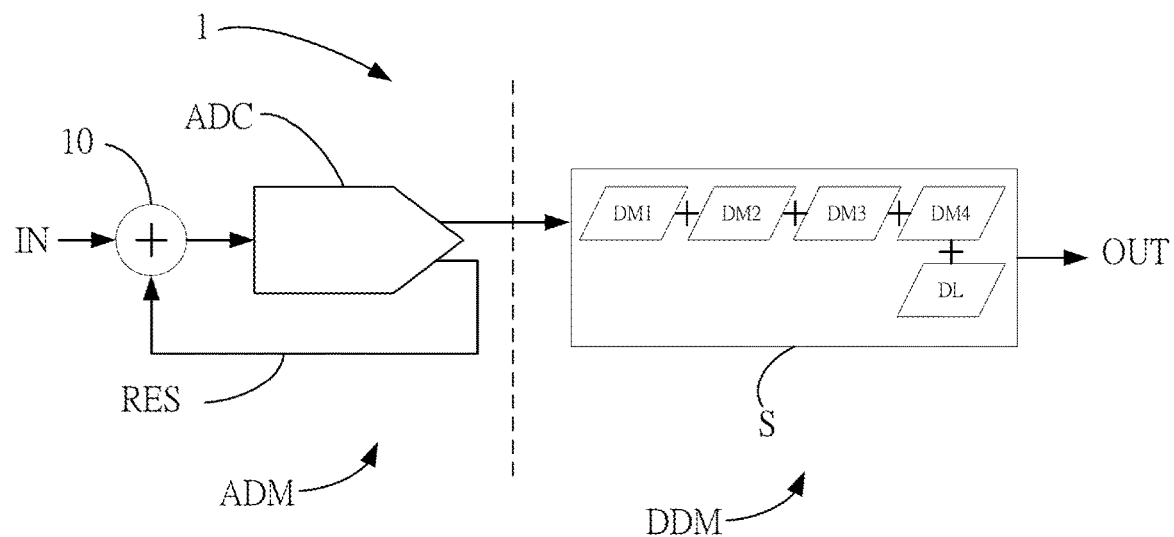
FIG. 5A shows a block diagram according to an embodiment of the present application.

Please refer to FIG. 5A. To execute the method for operating sensing signals according to the above embodiment of the present application, in an operational circuit 1 having an analog-to-digital converter ADC, a summation unit 10 receives a plurality of analog input signals IN sequentially, such as four analog input signals IN, and operates the corresponding MSB data DM1 DM2, DM3 of the first three analog input signals IN in the analog domain ADM. Because the first three analog input signals IN are not the final analog input signal, the residue RES after the MSB operation is merged to the next analog input signal. The analog-to-digital converter ADC still operates the MSB data. DM4 of the fourth analog input signal IN. In particular, being the final analog input signal IN, the analog-to-digital converter ADC will also operate the corresponding LSB data DL of the fourth analog input signal. The fourth analog input signal IN has merged and accumulated the residues RES after operating the MSB data of first three analog input signals IN. In the digital domain, an operating unit S can register or operate the above MSB data DM1~DM4 and the LSB data DL for generating the digital output signal OUT. For example, the operating unit S can perform an accumulation operation on the first MSB data DM1, the second MSB data DM2, the third MSB data DM3, the fourth MSB data DM4, and the LSB data DL for forming the digital output signal OUT=DM1+DM2 DM3+DM4+DL.

To elaborate, please refer to FIG. 3 and FIG. 4. In the step S110, perform the MSB operation on the first analog input signal IN to give the corresponding MSB data DM1. The operating unit S registers the first MSB data DM1. Next, in the step S115, judge if the first analog input signal IN is the final analog input signal. If not, the step S120 is executed for merging the residue RES of the MSB operation to the next analog input signal and the step S110 is repeated on the next analog input signal (the second analog input signal IN). The above process is repeated. After the fourth analog input signal operates and gives the corresponding fourth MSB data DM4 of the fourth analog input signal IN in the step S110, the fourth analog input IN is judged as the final analog input signal in the step S115. Then the step S20 is executed. In the step S20, operate the corresponding LSB data DL of the fourth analog input signal IN and use the operating unit S to register or operate the above MSB data DM1~DM4 and the LSB data. DL for generating the corresponding digital output signal OUT and outputting the digital output signal OUT to the digital domain DDM. It is noteworthy that the operating unit S can perform prompt operations each time it receives the MSB data DM1~DM4 and the LSB DL, such as the accumulation operations as described above. Alternatively, the operating unit S does not perform operations until it receives all the MSB data DM1~DM4 and the LSB data DL. Alternatively, according to some embodiments of the present application, the operating unit S only registers the above MSB data DM1~DM4 and the LSB data DL and performs no operation before it output them as the digital output signal OUT for other systems.

Figure 5B:
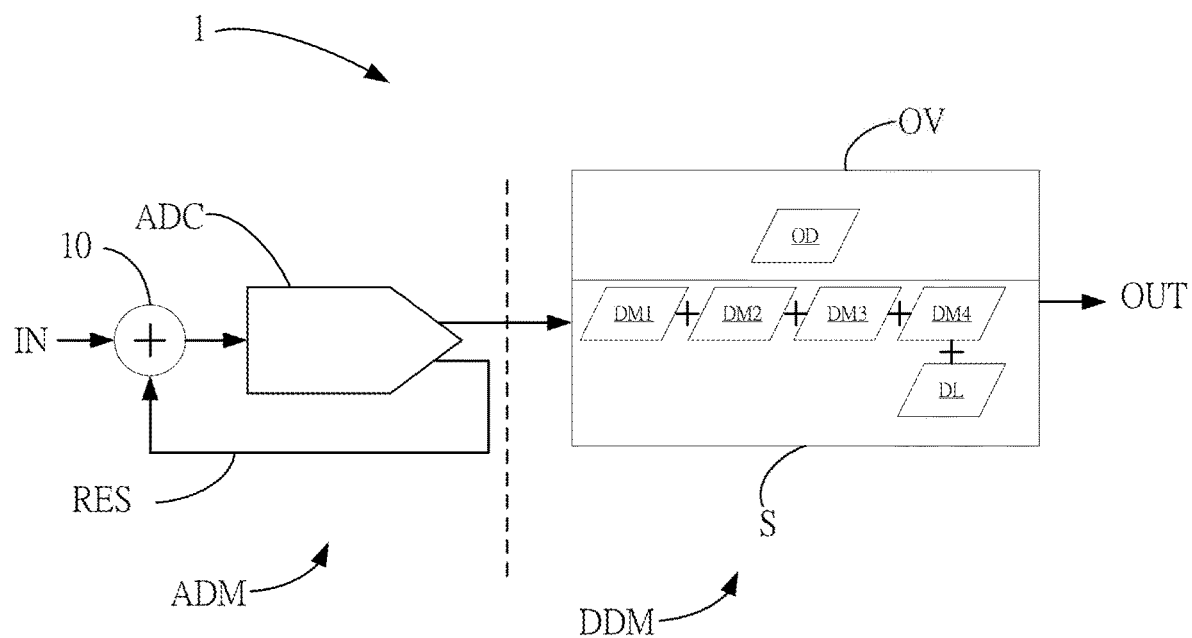
FIG. 5B shows a block diagram including overflow data according to an embodiment of the present application.

In other words, the above steps S110 and S120 are executed for a plurality of times for extracting the plurality of MSB data DM1, DM2, DM3 of the plurality of analog input signals IN. The plurality of MSB data DM1, DM2, DM3 are registered or operated until the reception of the final analog input signal. Then the steps S110 and S20 are executed, in which the operational circuit 1 extracts the corresponding fourth MSB data DM4 and the LSB data DL of the fourth analog input signal for registering or performing merge operations and generating the digital output signal OUT. In addition, as shown in FIG. 5A and FIG. 5B, which show block diagrams of the operational circuit 1 according to an embodiment of the present application, the analog-to-digital converter ADC is connected to the operating unit S in the operational circuit 1. Thereby, the above MSB data DM1~DM4 and the LSB data DL can be registered in the operating unit S. Furthermore, as shown in FIG. 5B, according to the previous embodiment, the operating unit S can perform accumulation operations on the above MSB data DM1~DM4 and the LSB data DL. If the operating result includes carrying, the digital output signal OUT can include an overflow data OD.

Figure 6A:
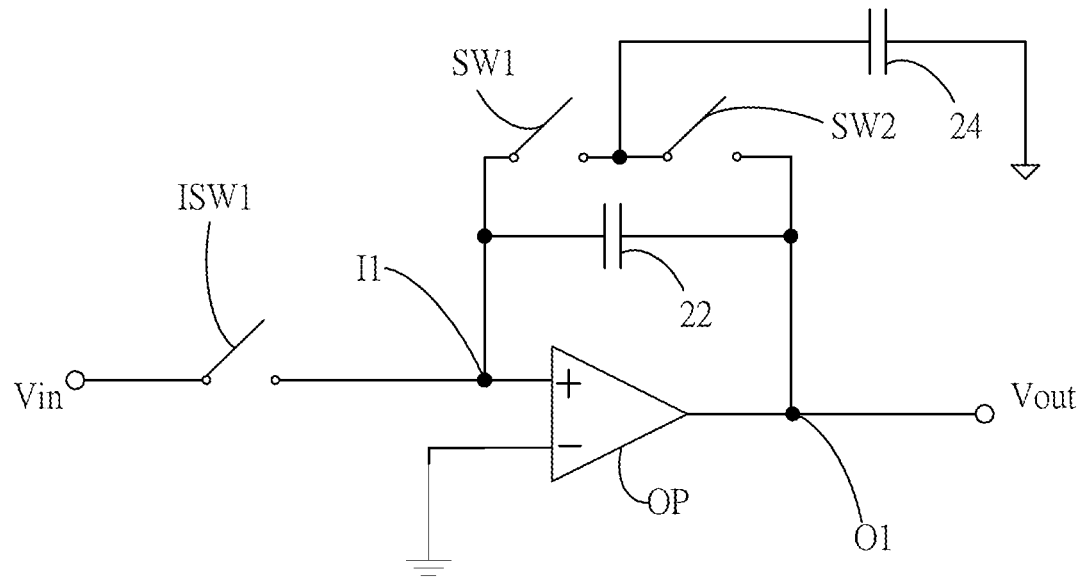
FIG. 6A shows a circuit diagram according to an embodiment of the present application.

Please refer to FIG. 6A, which shows a partial circuit diagram of the operational circuit 1 according to the present application. As shown in the figure, the operational circuit 1 includes an operational amplifier OP, a first register 22, and a second register 24 for corresponding to the summation unit 10 and the analog-to-digital converter ADC. The first register 22 is coupled to an output and an input of the operational amplifier OP; the second register 24 is coupled to the output or the input of the operational amplifier OP The first register 22 and the accompanying operational amplifier OP form the integrator required for an analog-to-digital converter ADC (such as a sigma-delta ADC) for sampling the plurality of analog input signals IN, so that the analog-to-digital converter ADC can operate the MSB data DM1, DM2, DM3, DM4 of the plurality of analog input signals IN. Besides, the second register 24 merges the residues RES of the MSB operations to the next analog input signal, as detailed below.

A first terminal of the first register 22 is coupled to a first input I1 of the operational amplifier OP. A second terminal of the first register 22 is coupled to a first output O1 of the operational amplifier OP. A first terminal and a second terminal of the second register 24 are coupled to a first switch SWI and a second switch SW2, respectively. The first switch SW1 is coupled to the first input I1 of the operational amplifier OP. The second switch SW2 is coupled to the first output O1 of the operational amplifier OR According to the present embodiment, the first register 22 and the second register 24 are capacitors for registering analog signals. In addition, the first input I1 is further coupled to a first input switch ISW1, which is controlled to close for the operational amplifier OP to receive analog input signals IN. For the rest of time, the first input switch ISW1 is open for opening the loop.

Figure 6B:
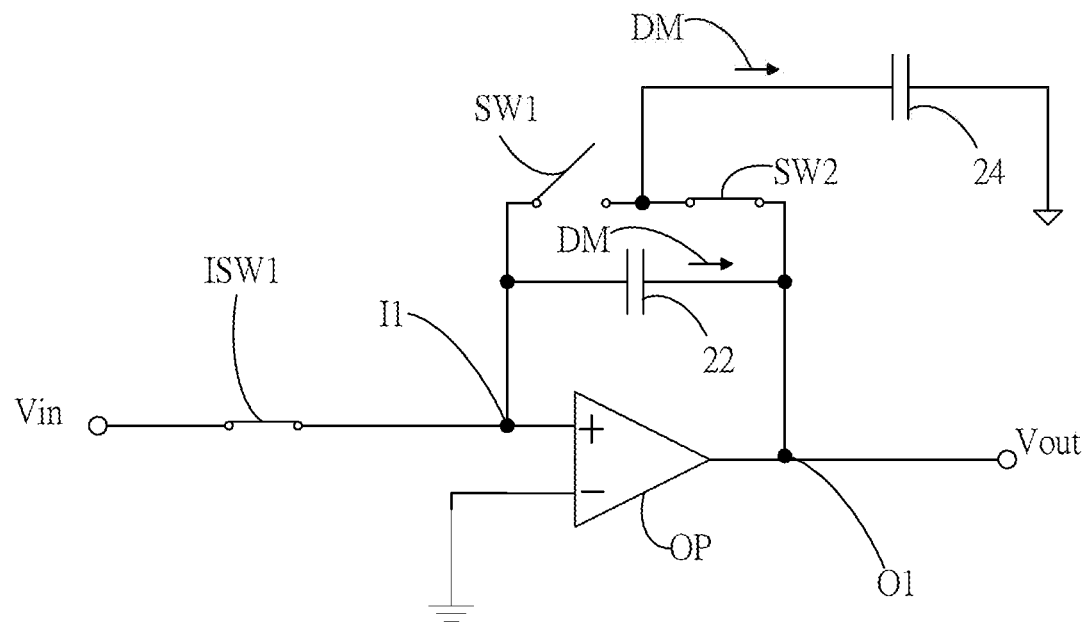
FIG. 6B shows a schematic diagram of registering data according to an embodiment of the present application.
Figure 6C:
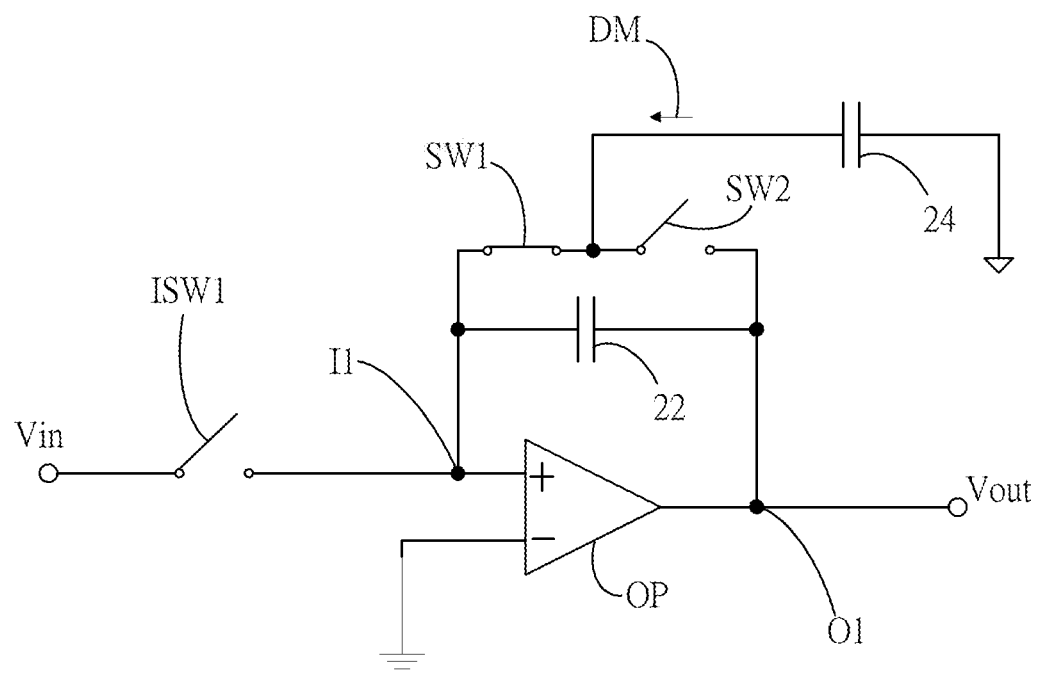
FIG. 6C shows a schematic diagram of merge operations according to an embodiment of the present application.
Figure 7:
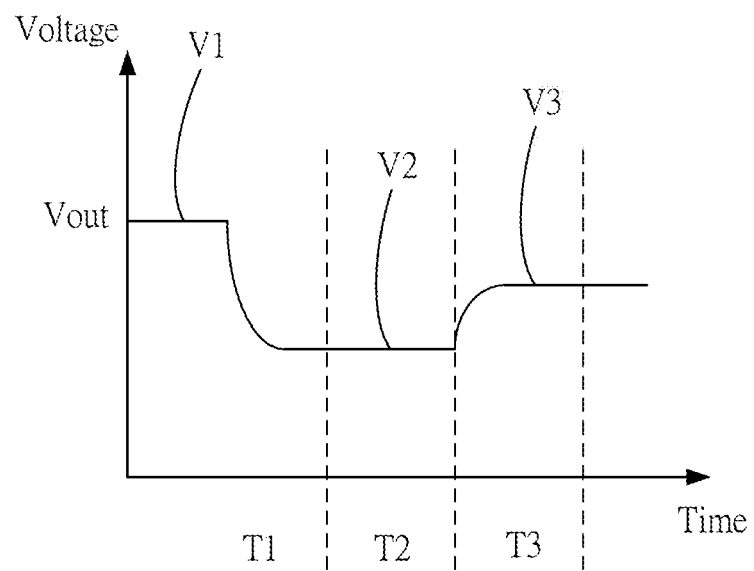
FIG. 7 shows a waveform diagram of signal versus time according to another embodiment of the present application.

Please refer to FIG. 6B, FIG. 6C, and FIG. 7. After the operational amplifier OP receives the analog input signal IN, in the first period Tl, the first register 22 reaches the first voltage V1 while extracting the MSB data DM1, DM2, DM3, or DM4 after receiving the analog input signal IN, making the terminal voltage of the first output O1 reach the first voltage V1. In the second period T2, the analog-to-digital converter ADC has completed the MSB DATA operations. Thereby, at this time, the component of the MSB data DM1, DM2, DM3, or DM4 is subtracted from the terminal voltage of the first output O1, making the voltage be the second voltage V2. Since the first switch SW1 is open and the second switch SW2 is closed, the second register 24 can store the second voltage V2, namely, the residue RES after the MSB operation. Finally, before entering the third period T3, the first switch SW1 is closed and the second switch SW2 is open. Then the second register 24 can merge the stored second voltage V2 to the next analog input signal for merge operation after entering the third period T3.

According to the above embodiments, the MSB data DM1~DM4 and the LSB data DL of the plurality of analog input signals IN are summed to generate the digital output signal OUT. Thereby, when merging the residue RES of the MSB operation to the next analog input signal, the summation method will be adopted as well. Nonetheless, as described above, if the operational method and the circuit thereof are applied to proximity sensing, to avoid the influence from the ambient light, the photosensor should sense when the light source is on and off, respectively. Then the component of the ambient light is subtracted to eliminate the influence from the ambient light. To achieve this, the operational method and the circuit thereof according to another embodiment of the present application is described as below.

Figure 8:
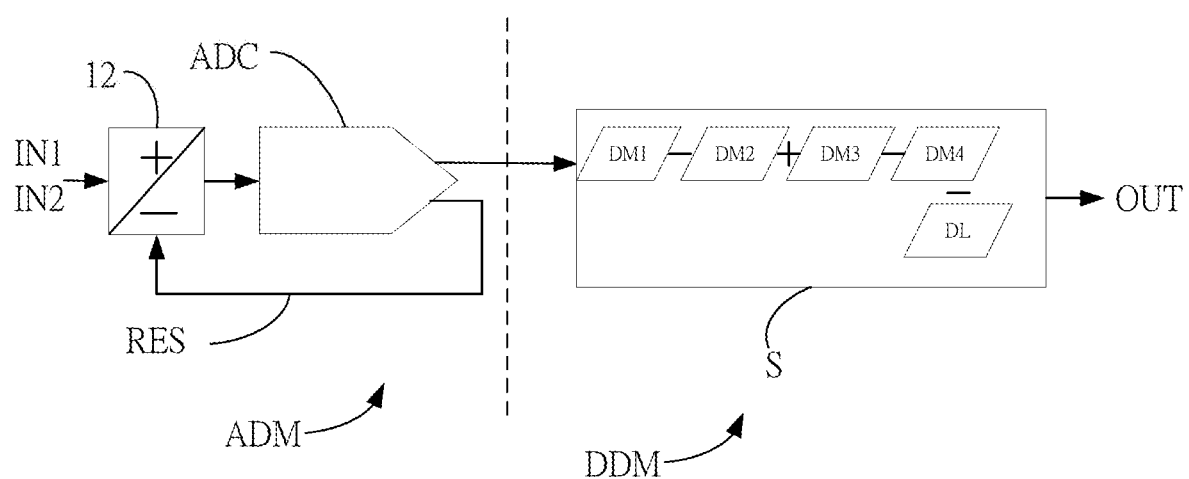
FIG. 8 shows a block diagram according to another embodiment of the present application.
Figure 9A:
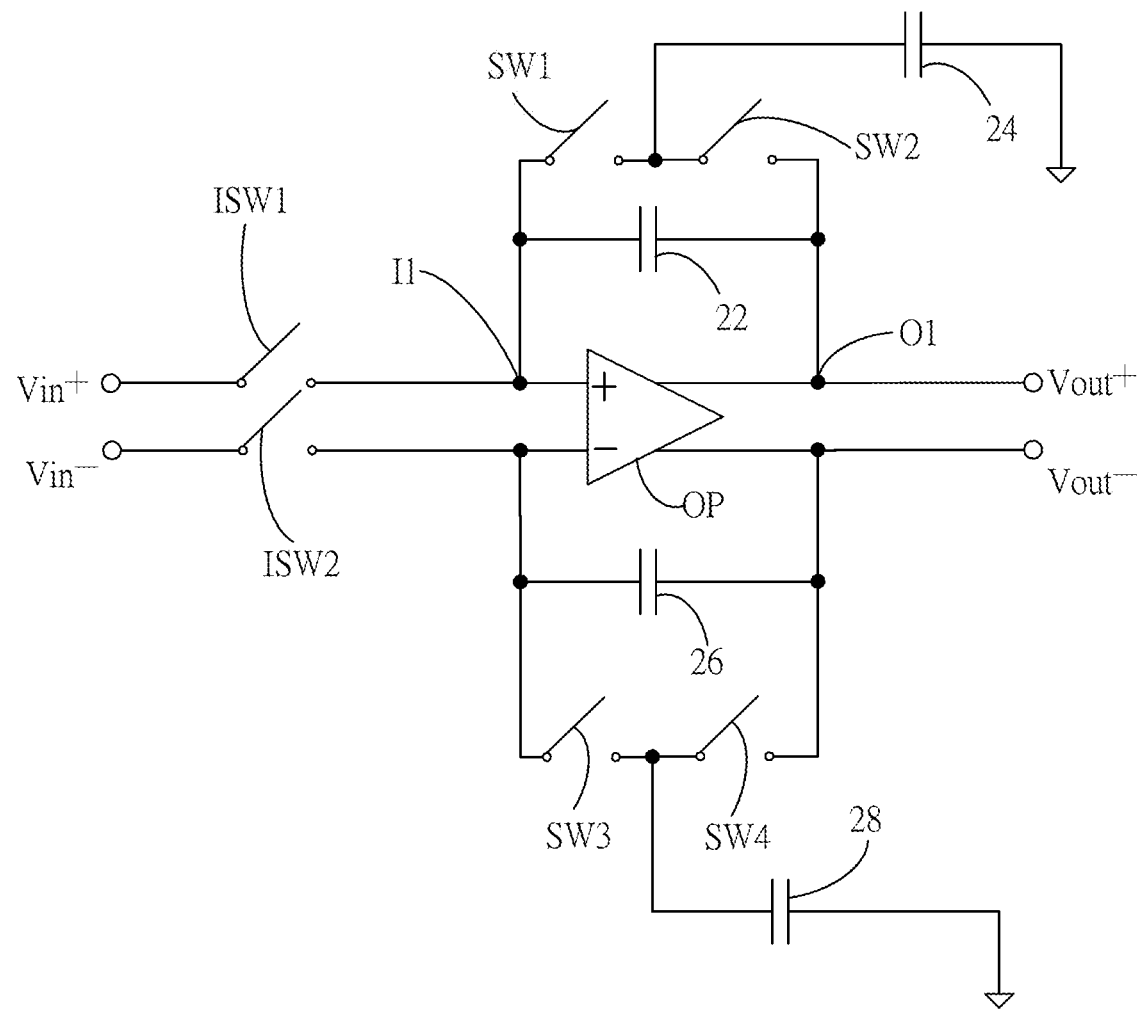
FIG. 9A shows a circuit diagram according to another embodiment of the present application.
Figure 9B:
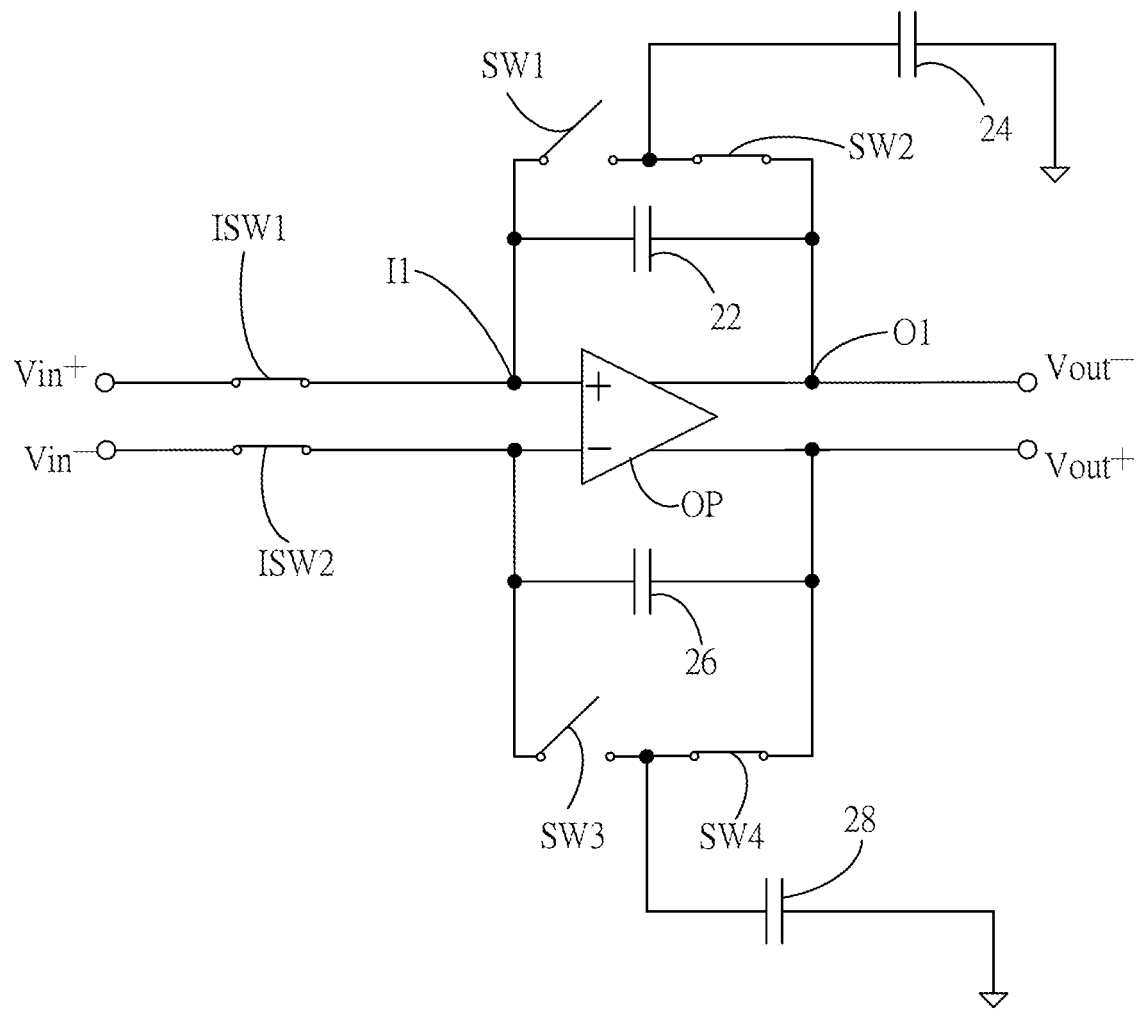
FIG. 9B shows a schematic diagram of registering data according to another embodiment of the present application.
Figure 9C:
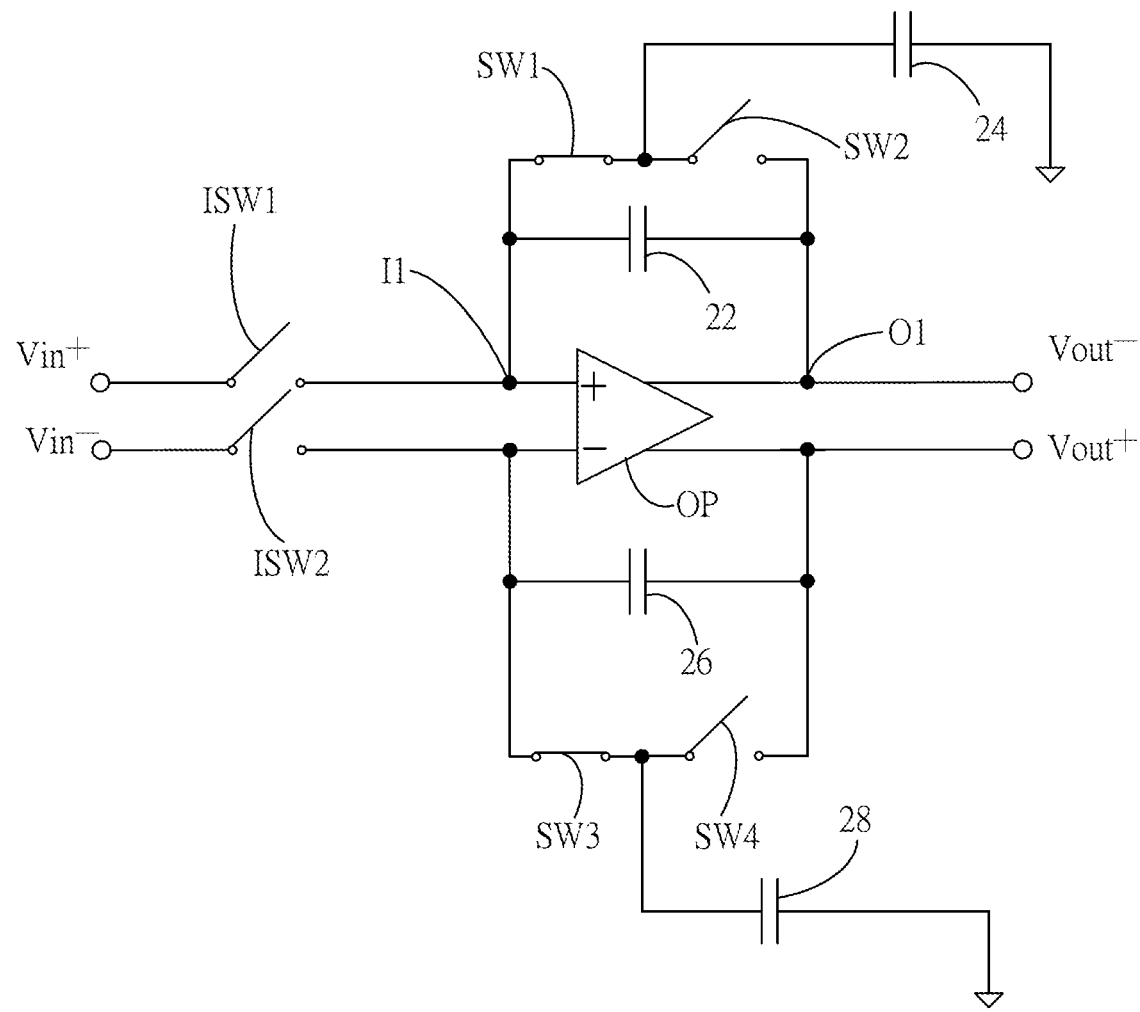
FIG. 9C shows a schematic diagram of merge operations according to another embodiment of the present application.
Figure 10:
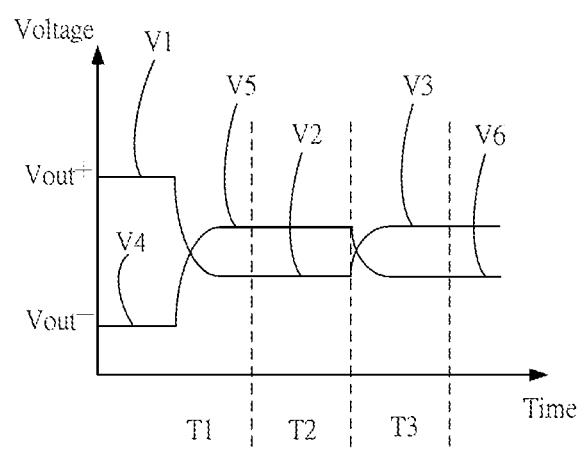
FIG. 10 shows a waveform diagram of signal versus time according to another embodiment of the present application.

Please refer to FIG. 8, which shows a block diagram of the operational circuit 1 according to another embodiment of the present application. The operational circuit 1 can be applied to the method for operating sensing signals according to another embodiment of the present application. The difference between FIG. 5A and FIG. 8 is that the summation unit 12 in FIG. 8 further includes the function of subtraction and the analog input signal IN is divided into a first analog input signal IN1 and a second analog input signal IN2. The first analog input signal IN1 and the second analog input signal IN2 have different phases. The first analog input signal IN1 can be the sensing result of the photosensor when the light source is on; the second analog input signal IN2 can be the sensing result of the photosensor when the light source is off.

In the operational method for sensing signal according to another embodiment of the present application, the operational circuit receives, likewise, four analog input signals. The first and third analog input signals IN are the first analog input signal IN1, such as the sensing result when the light source is on; the second and fourth analog input signals IN are the second analog input signal IN2, such as the sensing result when the light source is off. Accordingly, the operating unit S can subtract the MSB data DM2, DM4 acquired by the second analog input signal IN2 from the MSB data DM1, DM3 acquired by the first analog input signal IN1. In addition, because the final analog input signal is the second analog input signal IN2, the LSB acquired by the final analog input signal is further subtracted from the first analog input signal IN1 to form the digital output signal OUT=DM1−DM2+DM3−DM4−DL. Thereby, when the second analog input signal IN1 is the sensing result of the photosensor when the light source is on and the second analog input signal IN2 is the sensing result of the photosensor when the light source is off, the component of the ambient light can be subtracted from the digital output signal OUT effectively. It is noteworthy that a person having ordinary skill in the art can think of exchanging the arrangement and application of the first analog input signal IN1 and the second analog input signal IN2 for forming the digital output signal OUT similar to −DM1+DM2−DM3+DM4+DL. The exchange is still under the scope of the present application.

Furthermore, because the first analog input signal IN1 and the second analog input signal IN2 are input alternately, while merging the residue RES of the MSB operation to the next analog signal, the residue RES should be subtracted from the next analog input signal. For example, please refer to FIG. 9A to FIG. 9C and FIG. 10, which shows a circuit diagram, a schematic diagram of the registering data, and a schematic diagram of merge operation according to another embodiment of the present application. The difference between FIG. 6A~FIG. 6C and FIG. 9A~FIG. 9C is that the latter further include a third register 26 and a fourth register 28. The connection between the first register 22 and the second register 24 is symmetrical to the connection between the third register 26 and the fourth register 28. According to the above embodiment, when the residue RES of the MSB operation is merged to the next analog input signal, the method of subtracting the residue RES from the next analog input signal can be adopted. It is noteworthy that no matter the first register 22 or the integrator required for forming the analog-to-digital converter ADC (such as sigma-delta ADC) with the operational amplifier OP, the residue RES is stored in the external register before being merged to the register of the integrator. Nonetheless, if the analog-to-digital converter ADC is a cyclic ADC, a pipeline ADC, or an analog-to-digital converter in other forms, the residue RES can be stored directly in the sample-and-hold amplifier, instead of the integrator. Nonetheless, the present application is not limited to the embodiment.

Figure 11:
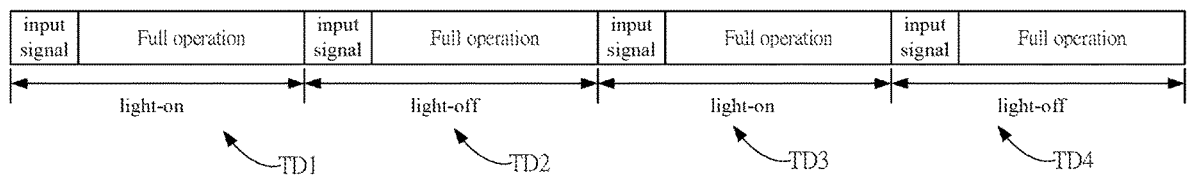
FIG. 11 shows a schematic diagram of the operating time according to the prior art.

As shown in FIG. 11, like the previous embodiment, the analog input signals formed by four sensing signals acquired by two light-on states and two light-off states are used for description. In the method for operating sensing signals according to the prior art, the MSB data DM and the LSB data DL of each analog input signal are operated, which make each of the operating periods TD1, TD2, TD3, TD4 being a full-length operation. Take 16-bit sensing signals for example. For simplicity, assume that the operating time for each bit is 1 µs. To achieve the MSB data DM and the LSB DL operations as a full operation, each of the operating periods TD1, TD2, TD3, TD4 requires 16 µs, leading to the total time required for analog-to-digital conversion being 64 µs. In addition, the sensing time for the light-on state and the light-off state will be limited by operating periods TD1, TD2, TD3, TD4, in which a 16 µs interval is required. Moreover, each merge operation for the LSB DL will lead to a quantization error in the operating result. Since four LSB DL are executed, four quantization errors will be included in the digital output signal OUT.

Figure 12:
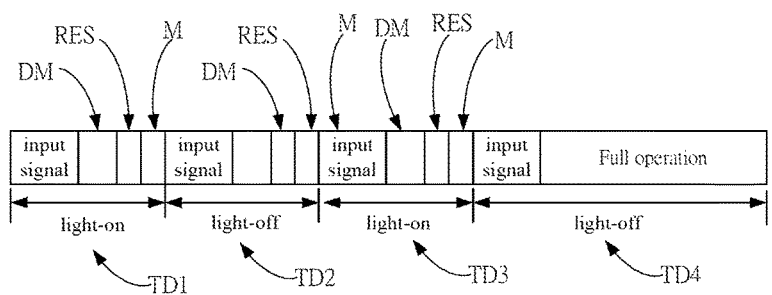
FIG. 12 shows a schematic diagram of the operating time according to the present application.

As shown in FIG. 12, m the method for operating sensing signals according to the present application, the MSB data DM is extracted in each, of the operating periods TD1, TD2, TD3, TD4. The LSB data DL operation is performed only in the final period. Like the previous embodiment, the analog input signals formed by four sensing signals acquired by two light-on states and two light-off states are used for description. Since the operation of the LSB data DL is performed only once, the influence of the quantization error on the digital output OUT of the present application occurs only once as well and thus substantially reducing the influence of quantization error on the accuracy in sensing signals. Besides, in the first operating period TD1 to the third operating period TD3, the MSB data DM is only sampled for merging the residue RES of MSB operation to the next analog input signal. No LSB operation is performed. Thereby, the first operating period TD1 to the third operating period TD3 are not full-length operations and hence shortening the operating time. Likewise, take 16-bit sensing signals for description. If the MSB data DM is 4-bit and the LSB DL is 12-bit, the first operating period TD1 to the third operating period TD3 use only 4 µs for MSB operation. The extraction of the residue RES and merging the residue RES to the next analog input signal consume only 1 µs approximately. Then each of the first operating period TD1 to the third operating period TD3 consumes 6 µs, respectively. The total time consumption for the analog-to-digital conversion is shortened to 34 µs. In addition, the sensing time for the light-on and light-off states can be shortened substantially from the above 16 µs to 6 µs, significantly reducing the interval between the light-on and light-off states for the proximity sensor.

To sum up. the method for operating sensing signals and the circuit thereof according to the present application extract and register MSB data for multiple times for integrated operation with the MSB data and LSB data in the final extraction. Thereby, the operating time can be shortened and the quantization error can be reduced.

Accordingly, the present application conforms to the legal requirements owing to its novelty, nonobviousness, and utility. However, the foregoing description is only embodiments of the present application, not used to limit the scope and range of the present application. Those equivalent changes or modifications made according to the shape, structure, feature, or spirit described in the claims of the present application are included in the appended claims of the present application.

The invention claimed is:

1. A method for operating sensing signals, comprising steps of:
   receiving a plurality of analog input signals sequentially;
   operating a corresponding most significant bit data of said analog signal and merging a residue to the operation of the next input signal; and
   after repeating to the final analog input signal, operating a most significant bit data and a least significant bit data of the final analog input signal, for generating a digital output signal.

2. The method for operating sensing signals of claim 1, wherein said step of operating a corresponding most significant bit data of said analog signal and merging a residue to the operation of the next input signal includes:
   operating said analog input signal for generating the corresponding most significant bit data and registering said most significant bit data; and
   merging the residue after the operation of said most-significant-bit data to the next analog input signal for operation.

3. The method for operating sensing signals of claim 2, where in said step of operating said analog input signal for generating the corresponding most significant bit data and registering said most significant bit data, said registered most significant bit is added to or subtracted from the corresponding most significant bit of the next analog input signal.

4. The method for operating sensing signals of claim 2, where in said step of merging the residue after the operation of said most-significant-bit data to the next analog input signal for operation, the residue of the most-significant-bit operation is subtracted from or added to the next analog input signal.

5. The method for operating sensing signals of claim 1, wherein an overflow data of said digital output signal is stored in an overflow space.

* * * * *